United States Patent
Kearns

(10) Patent No.: US 7,038,551 B2
(45) Date of Patent: May 2, 2006

(54) ANTENNA DUPLEXER

(75) Inventor: Brian Kearns, Dublin (IE)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/426,431

(22) Filed: Apr. 30, 2003

(65) Prior Publication Data

US 2003/0214369 A1 Nov. 20, 2003

(30) Foreign Application Priority Data

May 16, 2002 (EP) .................................. 02394063

(51) Int. Cl.
*H03H 9/72* (2006.01)
*H01L 41/08* (2006.01)

(52) U.S. Cl. .................................. 331/133; 310/313 D

(58) Field of Classification Search ................ 333/133, 333/193, 196, 189; 310/313 B, 313 R, 313 D
See application file for complete search history.

(56) References Cited

U.S. PATENT DOCUMENTS

| | | | |
|---|---|---|---|
| 5,515,015 A * | 5/1996 | Nakata ........................ 333/132 |
| 5,835,990 A | 11/1998 | Saw et al. ............... 310/313 D |
| 6,313,715 B1 | 11/2001 | Bergmann et al. .......... 333/133 |
| 6,346,864 B1 * | 2/2002 | Kadota ........................ 333/133 |
| 6,373,350 B1 | 4/2002 | Fujita .......................... 333/133 |
| 6,380,823 B1 * | 4/2002 | Ikata et al. .................. 333/133 |
| 6,489,860 B1 * | 12/2002 | Ohashi ........................ 333/133 |
| 6,714,099 B1 * | 3/2004 | Hikita et al. ................. 333/133 |
| 2001/0043024 A1 | 11/2001 | Takamine et al. |

\* cited by examiner

*Primary Examiner*—Dinh T. Le
(74) *Attorney, Agent, or Firm*—Darby & Darby

(57) ABSTRACT

An antenna duplexer (14') comprises a transmission (TX) filter (16) having an input and an output. The TX filter input is arranged to connect to a TX port of a mobile telecommunications handset and the TX filter output is arranged to connect to an antenna (12) for the mobile telecommunications handset. The duplexer further includes a Dual Mode Surface Acoustic Wave (SAW) type receiver (RX) filter (18') having an input and a balanced output. The RX filter input is arranged to connect to the antenna (12) and the RX filter output is arranged to connect directly to a balanced input RX port of the mobile telecommunications handset.

16 Claims, 9 Drawing Sheets

ANTENNA DUPLEXER

The present invention relates to an antenna duplexer for a mobile telecommunications handset.

Referring to FIG. 1, a mobile telecommunications handset usually includes a communications section 10 having a transmission (TX) port and a receiver (RX) port and these ports in turn share a common antenna 12.

Modern telecommunications systems require full duplex capability, i.e. a configuration of their electronic circuitry that allows simultaneous transmission and reception by the user. Duplexing can be achieved in a number of ways, but the method employed usually depends on the system of multiplexing which is used to allow several users to access the telecommunications network at the same time, for example: Time Domain Multiple Access (TDMA) employed in GSM (Global System for Mobile Communications) equipment; Frequency Domain Multiple Access (FDMA); or more recently Coded Domain Multiple Access (CDMA) equipment employed widely in North America. For TDMA based systems, duplexing is usually achieved by electronic switching between transmit and receive ports, so that only one of the TX and RX ports is electrically connected to the antenna at a given time. For FDMA and CDMA systems both TX and RX ports are connected to the antenna simultaneously.

A conventional antenna duplexer or branching circuit 14 has three single ended ports: one which is connected to an RX section of the handset; another which is connected to the TX section of the handset; and a third port which is connected to the shared antenna 12. The purpose of an antenna duplexer is to achieve separation between the TX signal and the RX signal so that radio frequency (RF) power from the TX port is fed efficiently to the antenna, and so that RF power from the TX port does not leak into the RX port thus interfering with the desired RX signal. Furthermore, the duplexer 14 should not attenuate the RX signal from the antenna, as this would result in reduced sensitivity of the RX port of the mobile telecommunications handset.

A conventional antenna duplexer such as described in EP Patent Application EP 667685 comprises two bandpass filters 16, 18 distributed on a substrate. One of the filters 16, hereafter referred to as the TX filter, is designed to have a passband, which coincides with that of the TX band of the mobile telecommunications system being used. The other filter 18, hereafter referred to as the RX filter, is designed to have a passband, which coincides with the RX band of the system. The TX filters and RX filters are typically dielectric filters. The substrate further comprises input and output terminals and metallized tracks so that the TX and RX filters can be connected to the TX and RX ports and the antenna of the communications handset. In addition, the duplexer includes a matching circuit 20, which is designed to optimize the isolation between the TX and RX filters 16, 18. The matching circuit 20 comprises a microstrip line or discrete elements such as inductances and capacitances.

It is also known for a duplexer to comprise two ladder type Surface Acoustic Wave (SAW) filters rather than the dielectric filters mentioned above, for example, as disclosed in EP Patent Number EP0928064. FIG. 2 shows the principal features of a SAW resonator component of such a filter. The resonator comprises an inter-digitated transducer (IDT) having an input and an output. The IDT further comprises of a pair of busbars 50, 53 and metallized fingers. One busbar 50 is connected to the input of the resonator and the other 53 is connected to the output The metallized fingers are alternately connected to the input busbar and output busbar of the IDT. On either side of the IDT are reflectors 57, which further comprise metallized fingers. The metallized fingers of the reflector can be electrically isolated from each other, or electrically connected to each other via metallized lines above and below the fingers of the reflector. The SAW resonator comprising the IDT, busbars, reflectors, and input and output is disposed on a piezoelectric substrate comprising for example Lithium Tantalate, Lithium Niobate, Quartz or Langasite. FIG. 3 shows a Pi-Type and a T-Type ladder SAW filter. Here, each filter comprises alternate series 31 and parallel 32 SAW resonators. A conventional ladder filter is usually designed so that the resonance frequency (f1) of all of the series resonators 31 are the same, and so that the resonance frequency (f2) of all of the parallel resonators 32 are also the same. In addition frequency f1 is usually sufficiently greater than frequency f2, so that that the resonance frequency of the series resonators is approximately equal to the anti-resonance frequency of the parallel resonators. Finally, FIG. 4 shows an antenna duplexer utilising 2 ladder type SAW filters.

The advantage of using SAW filters for an antenna duplexer in place of dielectric filters is a reduction in the overall size of the duplexer. This is particularly important in the area of mobile telecommunications handsets where commercial viability is highly dependent on the overall size of the handset. Nonetheless, the metal of the Inter-Digital Transducers (IDT) of the constituent SAW filters must be specially chosen for high power handling ability above all else. This is because the principle drawback of using SAW filters in an antenna duplexer is a reduction in power durability. In any case, U.S. Pat. No. 6,316,860 and U.S. Pat. No. 5,929,723 are examples of patents which disclose high power durable metal electrodes suitable for SAW filters and these include Aluminium, Aluminium alloys and other metals based electrodes.

All of the above mentioned prior systems operate with a communications RX port adapted to receive an unbalanced signal, i.e. a single signal line as in for example FIGS. 3 and 4. At the same time, in the telecommunications industry it is often preferable to employ an electronic circuit with a balanced configuration, i.e. where the electrical signals are divided between two signal lines, where both electrical signals have the same amplitude, but where there is a phase difference of 180° between both signals. Balanced circuit configurations are less susceptible to noise and result in higher receiver sensitivity compared with unbalanced circuit configurations.

Ladder type SAW filters, however, can only provide an unbalanced output. Thus, if an antenna duplexer is to be used in a mobile communications handset with this type of architecture, it is necessary to connect an unbalanced to balanced converter (balun) between the RX output of the antenna duplexer and the RX port of the communications handset. Using an unbalanced to balanced converter has two negative effects: the first is the increase in size that results from the additional component; and the second is the inevitable loss that introducing an extra component brings.

According to the present invention there is provided an antenna duplexer according to claim 1.

The duplexer according to the invention enables connection of a single ended output from a TX section of a telecommunications handset to an antenna of the same handset, and simultaneous connection of the same antenna to a balanced input of the RX section of the telecommunications handset. The duplexer can have an output from the RX filter which is optimally matched to the input impedance of the RX section of the telecommunications handset. Additionally, the duplexer can be modified to be a conventional unbalanced RX output type by simply replacing the RX SAW filter contained therein. Changing to an unbalanced output RX filter requires no other change in the duplexer construction and consequently the duplexer can be easily modified for compatibility with all types of RX section handset architecture. Thus, a single duplexer package with the same pin configuration, TX filter, matching circuit and substrate is sufficient to realise an antenna SAW duplexer that can be connected directly to either an RX circuit with a single ended input or a RX circuit with a dual balanced input.

The duplexer can provide good isolation between the output of the TX section of the handset and the input of the RX section of the handset, but low loss between the output of the TX section and the antenna and between the antenna and the RX section of the handset. The invention avoids the need for a balun, which would ordinarily be required to convert the unbalanced RX output from the antenna duplexer to the balanced output which would be required by an RX section with a balanced input.

Embodiments of the invention will now be described with reference to the accompanying drawings, in which.

Figure 8A:
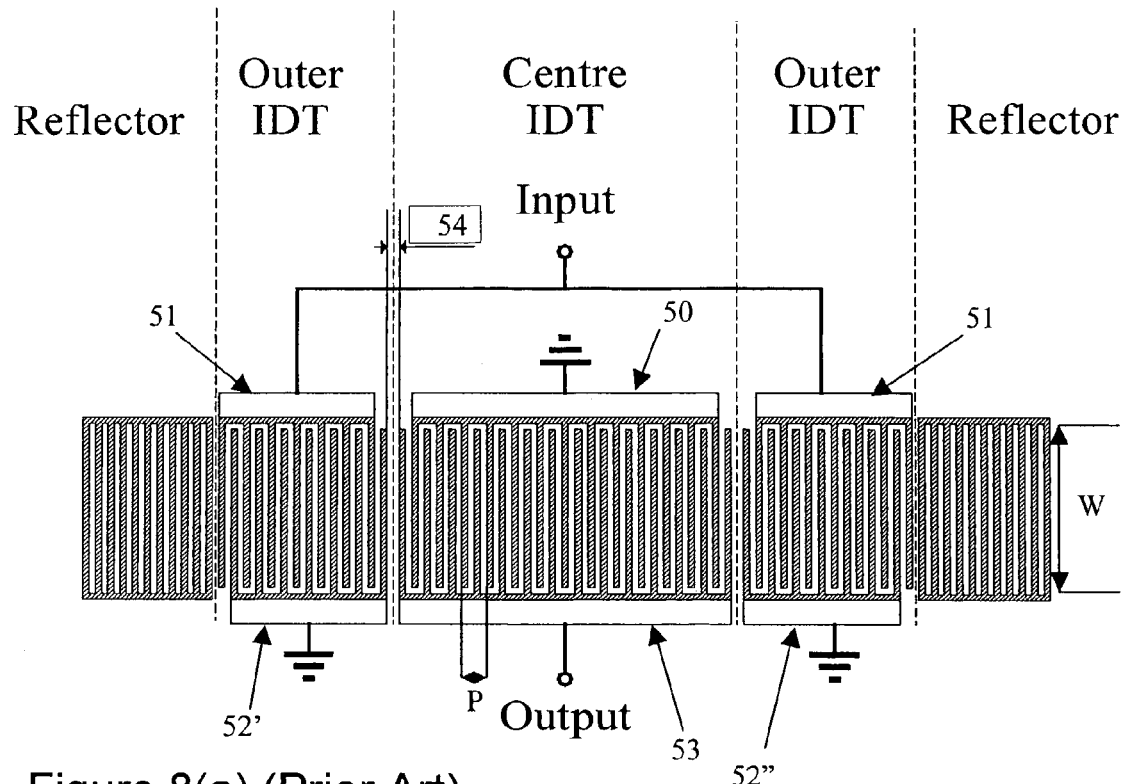
Figure 8B:
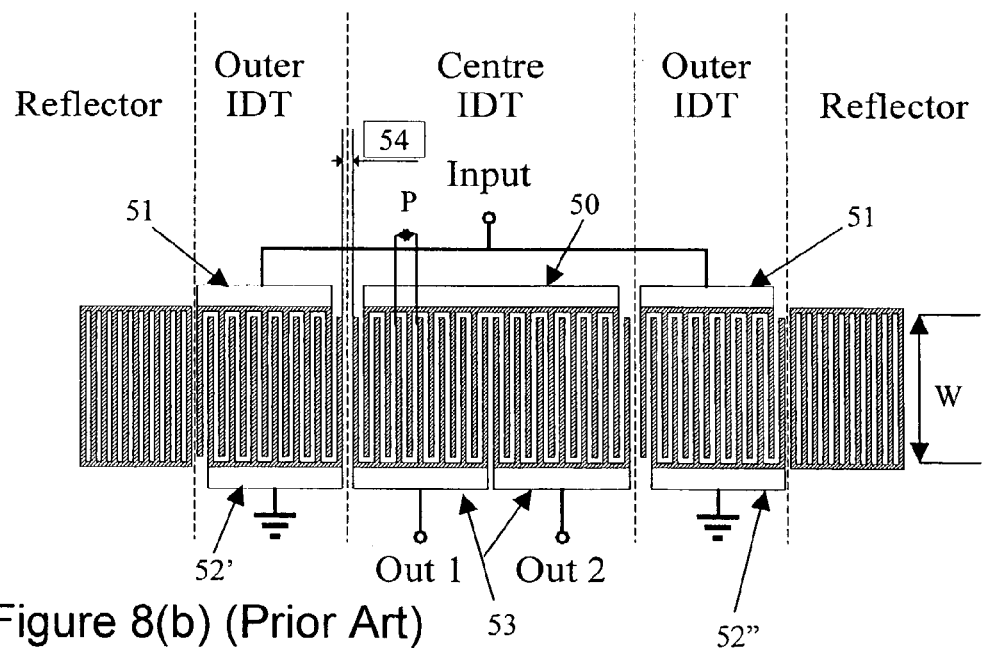
Figure 9A:
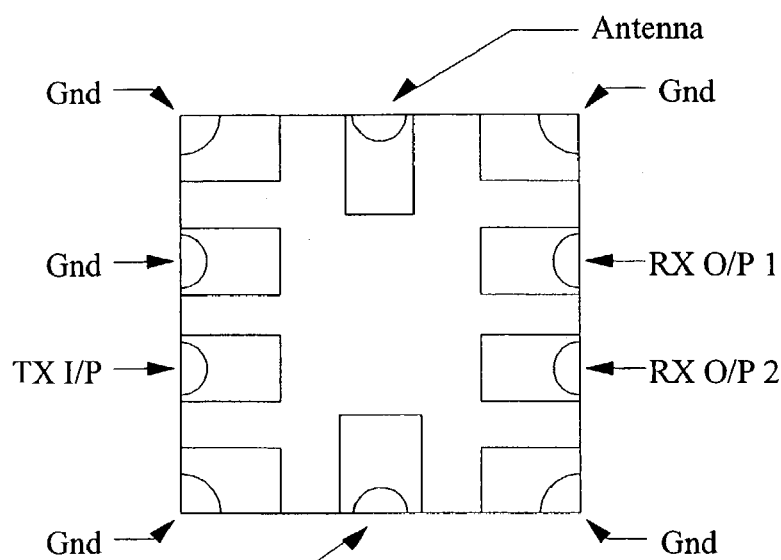
Figure 9B:
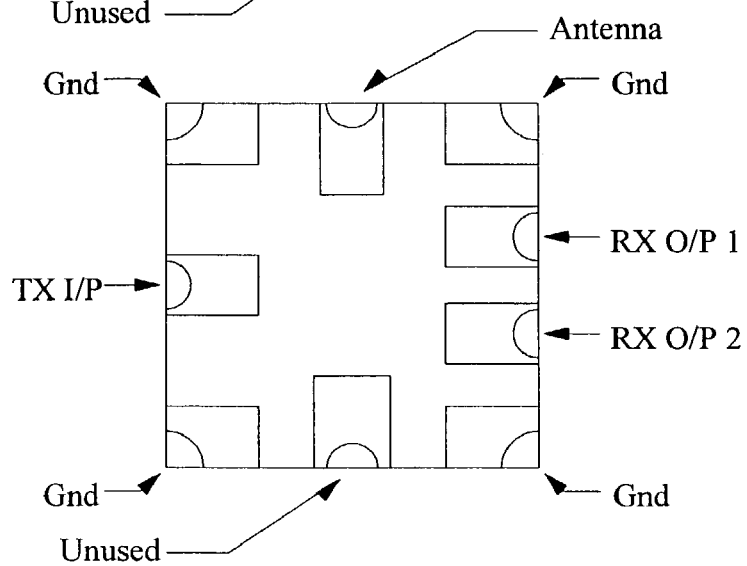
Figure 9C:
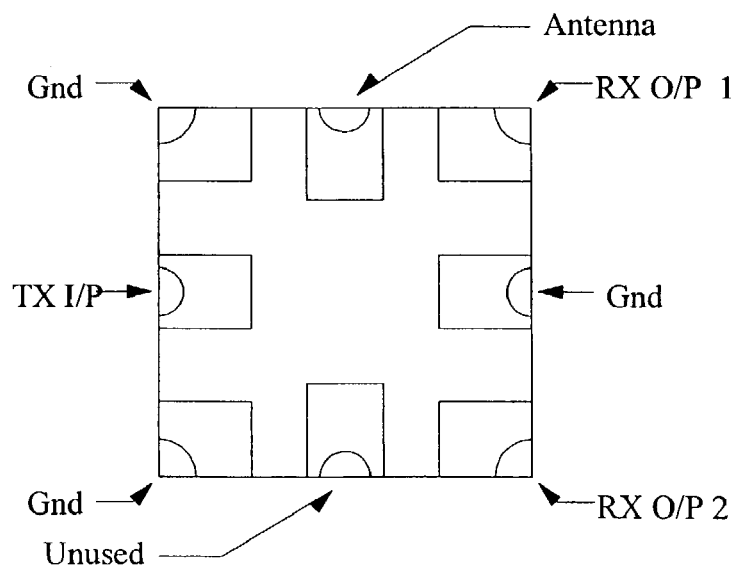
Figure 10A:
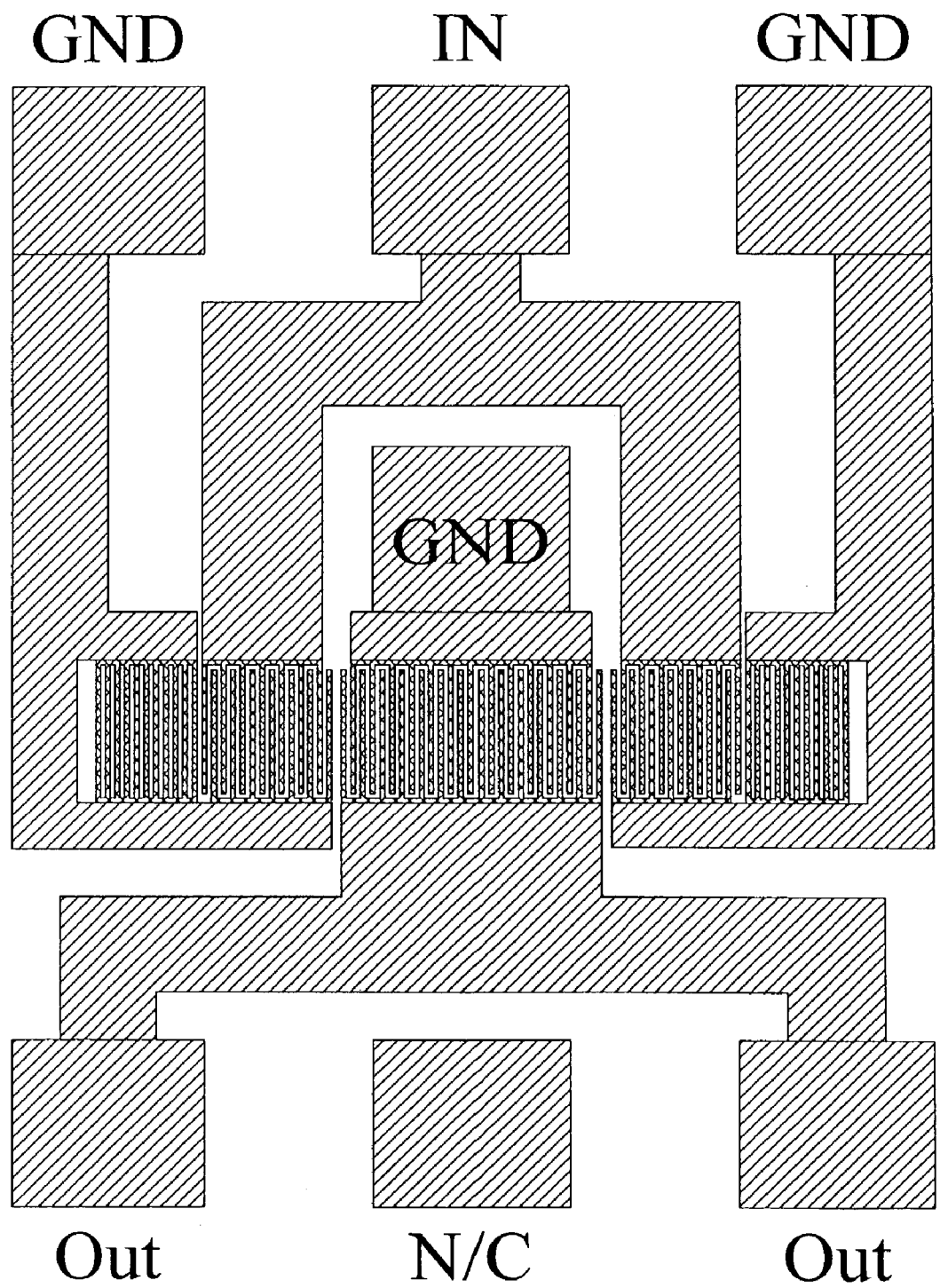
Figure 10B:
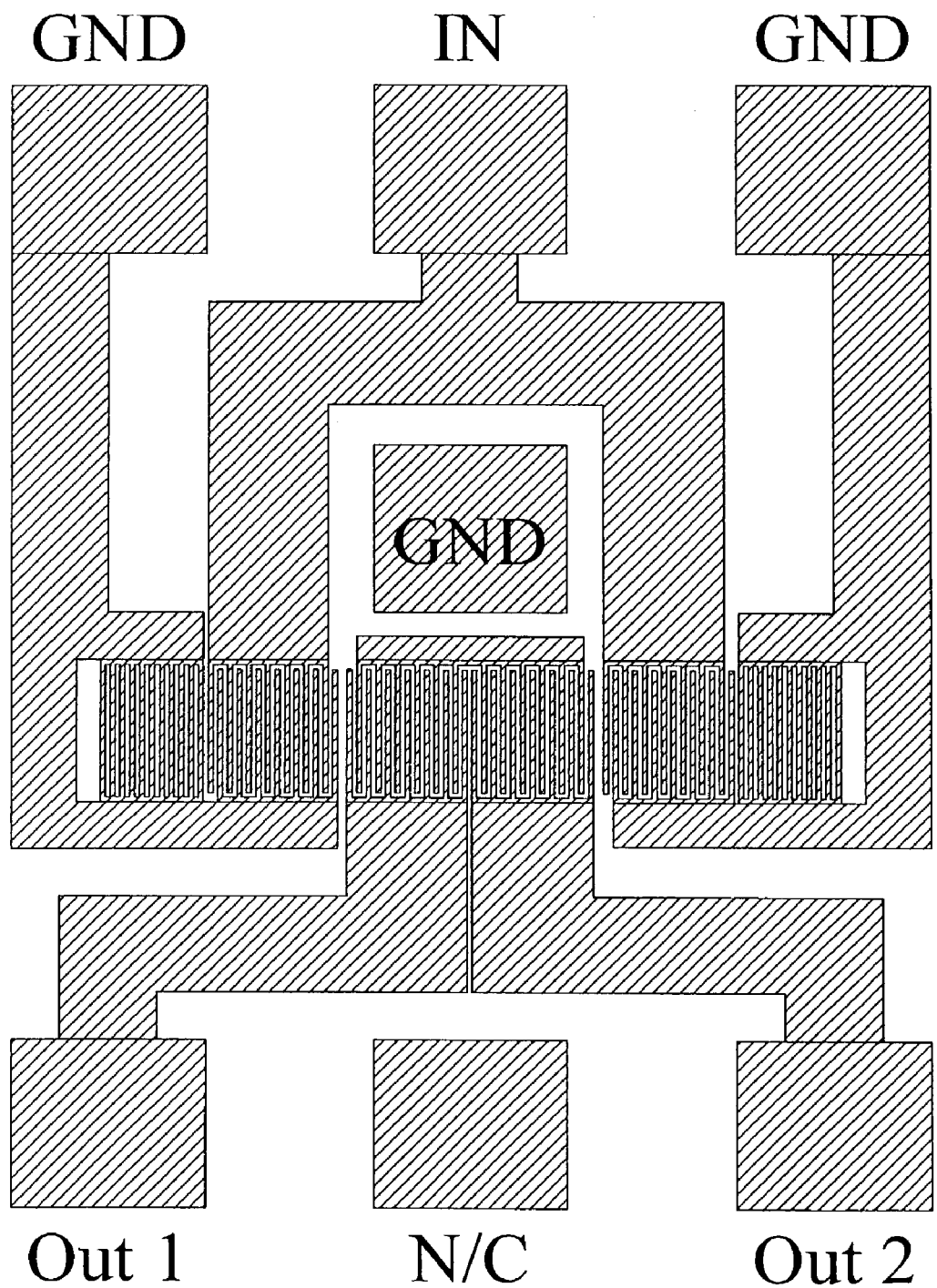

FIGS. 8(a) and 8(b) illustrate second configuration of conventional single section Dual-Mode (DMS) type SAW filter with unbalanced and balanced outputs respectively;

FIGS. 9(a) to 9(c) illustrate pin configurations for antenna duplexers according to various embodiments of the present invention; and FIGS. 10(a) and 10(b) show the layout on a piezoelectric substrate of the DMS type SAW filters of FIG. 8(a) and FIG. 8(b) respectively.

Figure 1:
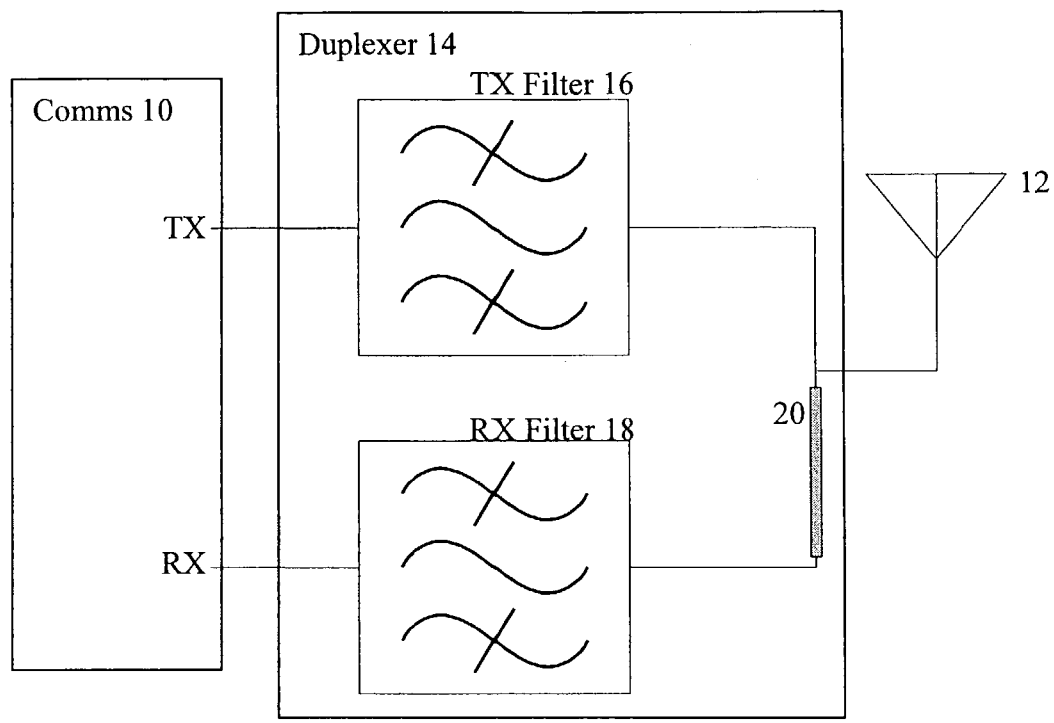
FIG. 1 is a schematic diagram of a conventional antenna duplexer.
Figure 2:
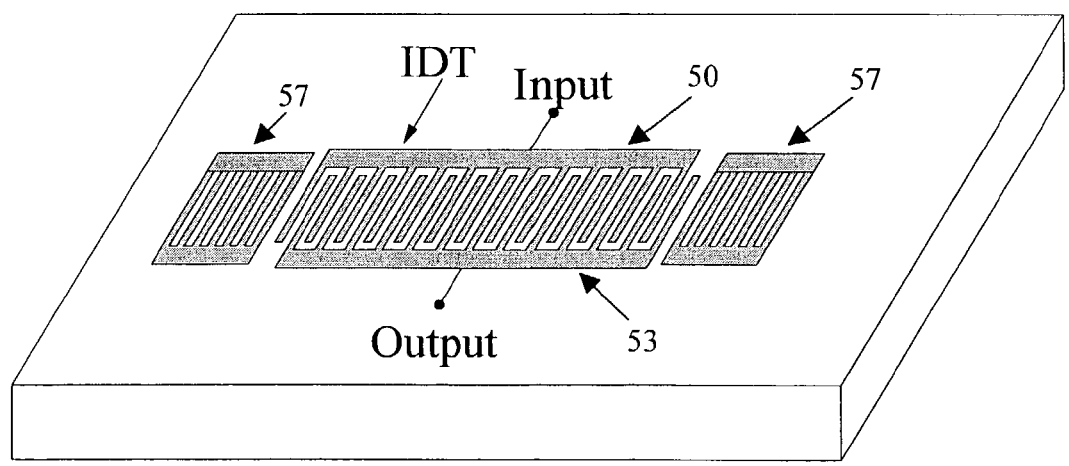
FIG. 2 illustrates a conventional Surface Acoustic Wave (SAW) resonator.
Figure 3:
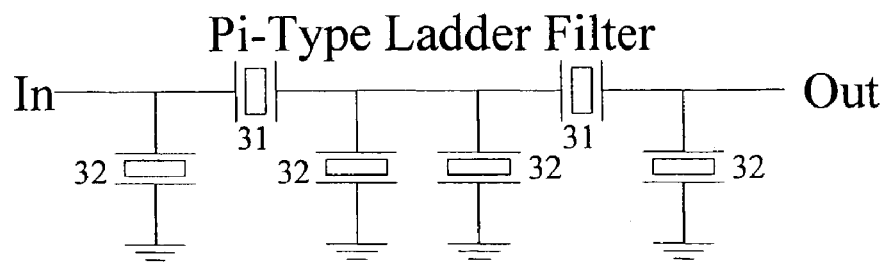
FIG. 3 illustrates a conventional ladder type SAW filter.
Figure 3:
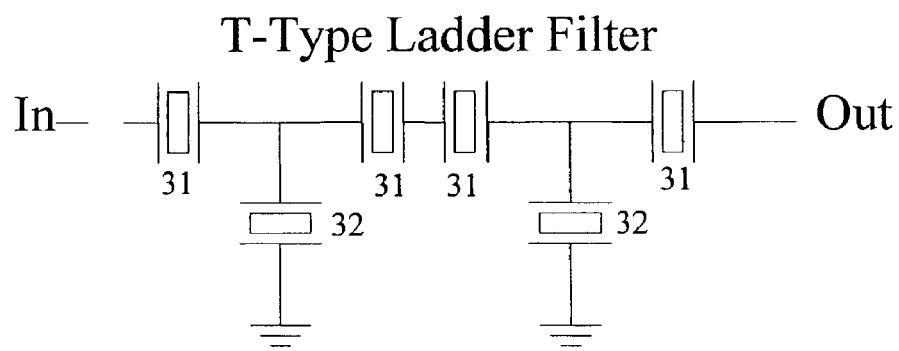
Figure 4:
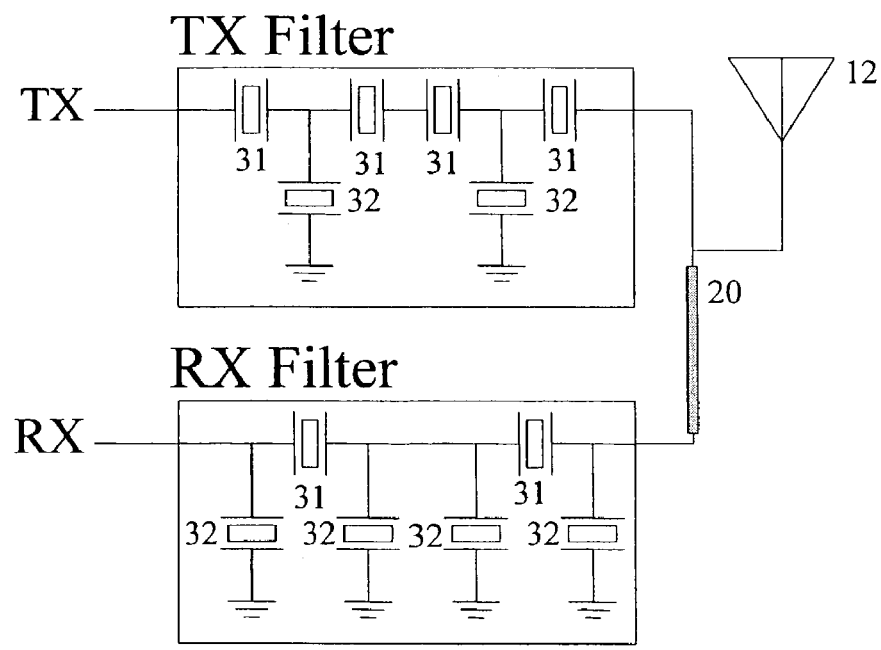
FIG. 4 is a schematic diagram of a convention SAW antenna duplexer using ladder type filters.
Figure 5:
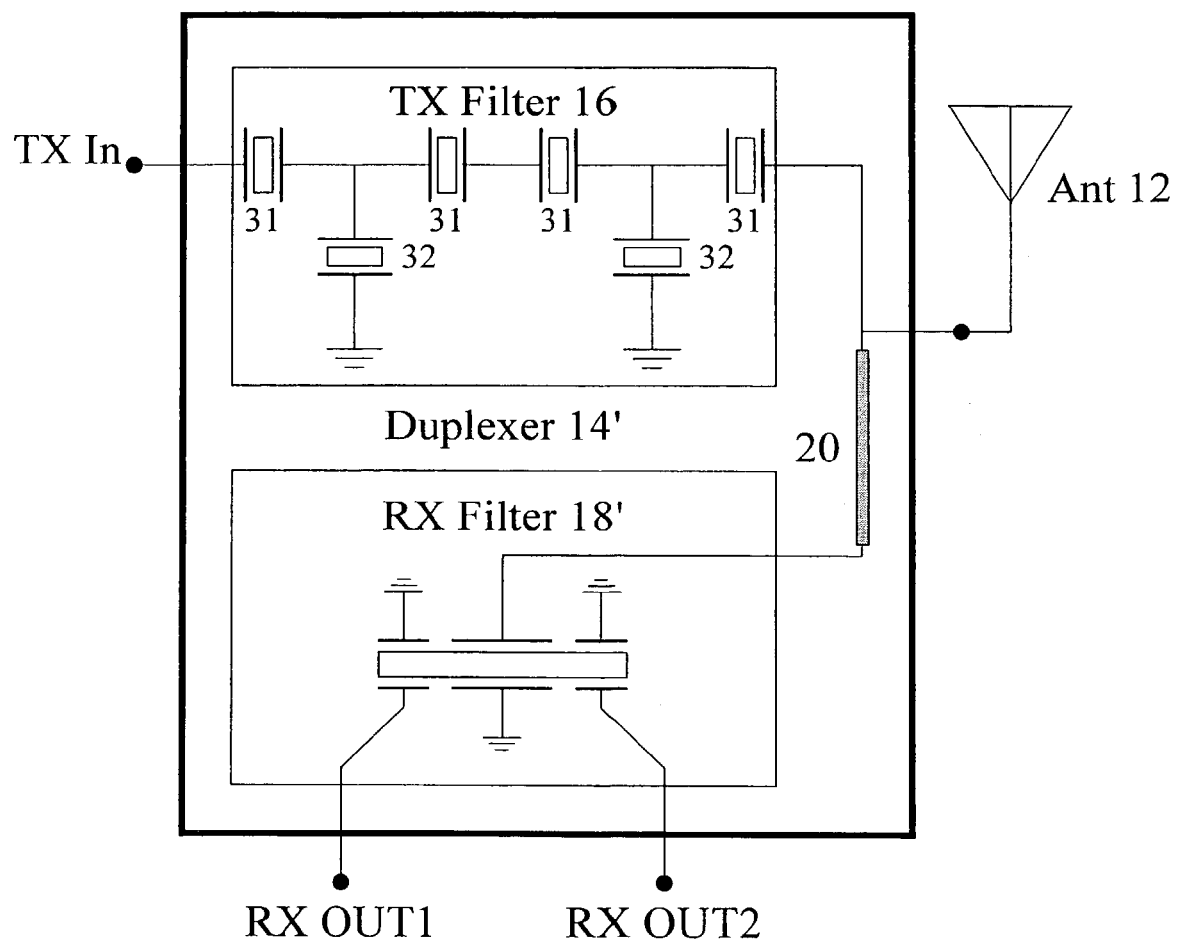
FIG. 5 is a schematic diagram of an antenna duplexer with a balanced output RX section according to the present invention.

Referring now to FIG. 5, a schematic diagram of a preferred embodiment of an antenna duplexer 14' of the present invention is shown. The duplexer comprises a package substrate which may be formed of Alumina (ceramic) or some plastic material such as, but not necessarily, Bismaleimide Triazine (BT) resin. Where Alumina is used, this can be produced using a low temperature co-fired ceramic (LTCC) process. A ladder type SAW TX filter 16 and a Dual Mode (DMS) type SAW RX filter 18' with a balanced output—RX Out1 and RX Out2 are mounted on the substrate. The duplexer further includes a matching circuit 20, which is designed to maximise the isolation between the TX and RX filters 16, 18'. The matching circuit can comprise either a matching strip or discrete elements such as inductors and capacitors as in the prior art. Where a multi-layer ceramic substrate is employed, the matching circuit can be integrated into the substrate. The package substrate further comprises TX input, RX output and antenna terminals which enable electrical connection between the antenna duplexer 14' and each of: the RX section of the mobile telecommunications handset, the TX section of the handset, and the antenna 12. Metallized tracks are disposed on the substrate so that the TX and RX filters 16, 18' and the matching circuit can be electrically connected to the package terminals. The TX and RX SAW filters include pads for electrical connection to the metallized tracks of the package substrate. Electrical connection between the TX and RX filters 16, 18' and the metallized tracks can be affected using metal bonding wires running between the pads on the filters and the metallized tracks, or using flip chip bonding. Where flip chip bonding is utilised, to affect electrical connection between the pads on the SAW filters and the metallized tracks on the package substrate, the bonds can be either solder balls, or gold bumps or any other type of suitable bond.

It will be seen that the TX filter 16 of the present invention can be a SAW type or any other type of filter that can be accommodated inside the package of the antenna duplexer. The TX filter has a passband which coincides with that of the TX band of the mobile communications system for which the duplexer will be used. The TX filter also has a stop band, or high rejection at the RX band of the mobile communications system. The TX filter may be a bandpass filter, a low pass type or a notch type. If the TX filter is a SAW type, then it can be any of the so-called ladder type SAW filter shown in FIG. 5, a notch type SAW filter, or a dual mode SAW type filter.

The RX filter 18' has a passband which coincides with the RX band of the mobile telecommunications system for which the duplexer will be used. The RX filter also has a stop band, or high rejection at the TX band of the mobile communications system. In any case, the present invention provides an antenna duplexer where the RX output of the duplexer can be connected directly to a dual balanced input of an RX input port of a communications handset.

Figure 6A:
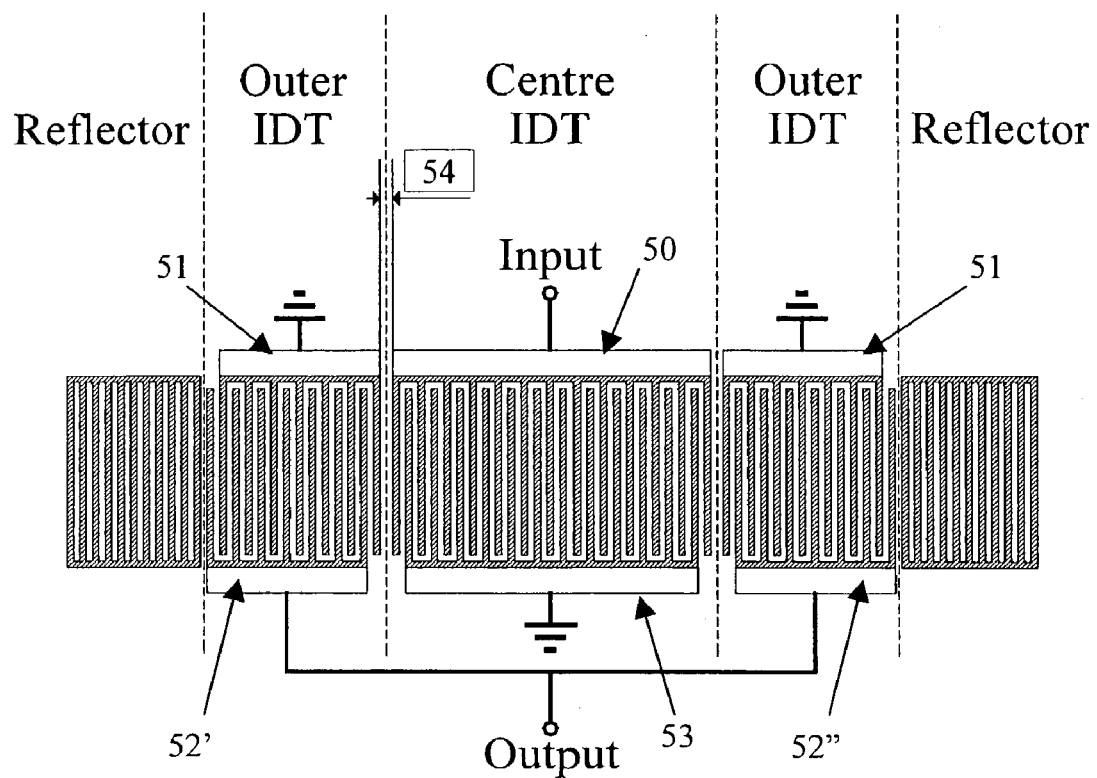
FIGS. 6(a) and 6(b) illustrate a first configuration of conventional single section Dual-Mode (DMS) type SAW filter with unbalanced and balanced outputs respectively.
Figure 6B:
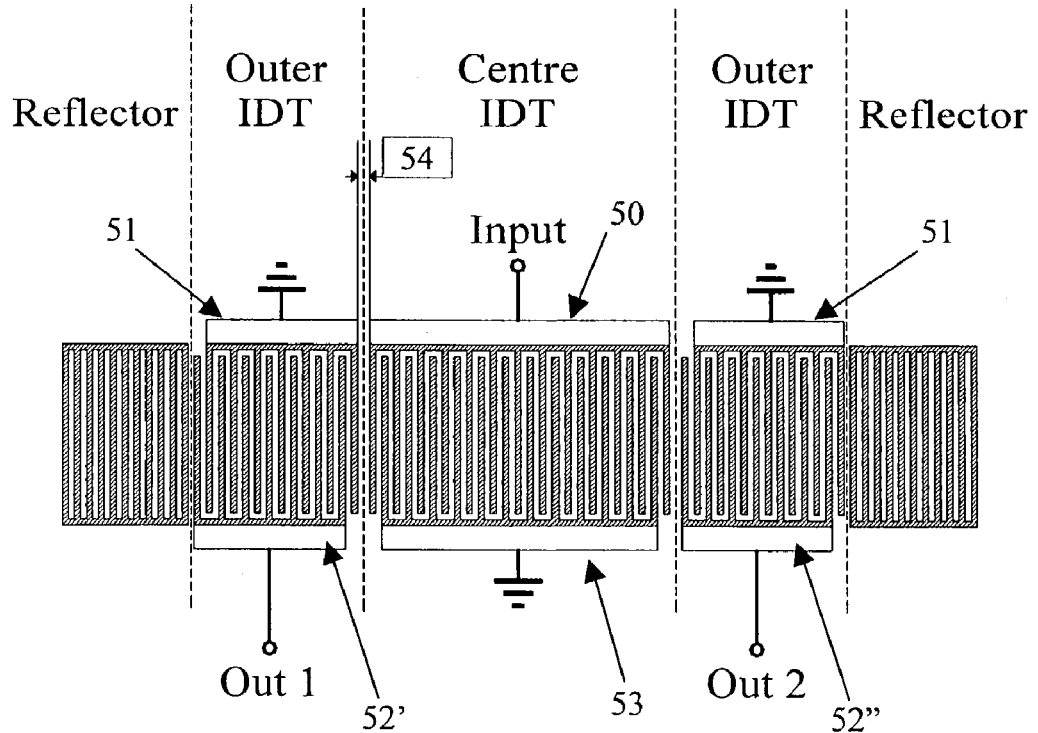

Turning now to the detailed construction of the RX filter 18', FIGS. 6(a) and 6(b) show the principle features of a single section DMS type SAW filter with unbalanced and balanced outputs respectively. In each case, the DMS SAW filter comprises a centre inter-digitated transducer (IDT), which (in the standard form) comprises a plurality of metallized fingers, which are disposed perpendicular to the direction of propagation of SAW energy, and which are alternately connected to an upper busbar 50, and a lower busbar 53. (The terms upper and lower are used in the specification to refer to the drawings only and do not imply any orientation of the device in use.) On both sides of the centre IDT is an outer IDT, which comprises basically the same structure as the centre IDT, with upper and lower busbars 51 and 52', 52" respectively. Typically each outer IDT has fewer fingers than the centre IDT, but the combined number of fingers of outer IDTs is greater than the number of fingers in the centre IDT. The three IDTs form a block comprising the left outer IDT, the centre IDT and the right outer IDT. On either side of this block is a pair of reflectors. A gap 54 between the centre IDT and the outer IDT, and the number of fingers in each IDT are adjusted to allow propagation of two longitudinal SAW modes between the reflectors. Adjusting the gap 54 between the centre IDT and the outer IDT and adjusting the numbers of fingers in each IDT enables optimisation of the bandwidth of the SAW filter.

The busbars 50–53 of each TDT are connected directly or indirectly to one of the input or output pads on the SAW chip via conducting signal lines. In both the filter configurations of FIGS. 6(a) and 6(b) the upper busbar 50 of the centre IDT is connected to the input, and the upper busbars 51 of the outer IDTs are connected to ground. Similarly, the lower busbars 53 of each of the outer IDTs are connected to ground. In the case of the unbalanced output of FIG. 6(*a*), however, the lower busbars 52', 52" of the outer IDTs are connected together and then to a single output pin, whereas in the case of the balanced output of FIG. 6(*b*) the lower busbars 52', 52" of the outer IDTs are connected to respective output pins. Hence, alternate fingers of the centre IDT are connected to the input and ground and alternate fingers of the outer IDTs are connected to one of the output(s) and ground. Depending on the polarity of the finger of the outer IDT nearest the edge of the centre IDT, the outputs can either be in phase or 180° out of phase. Nonetheless, it will be seen that this type of filter can be constructed to give a single unbalanced output or a dual balanced output.

Figure 7:
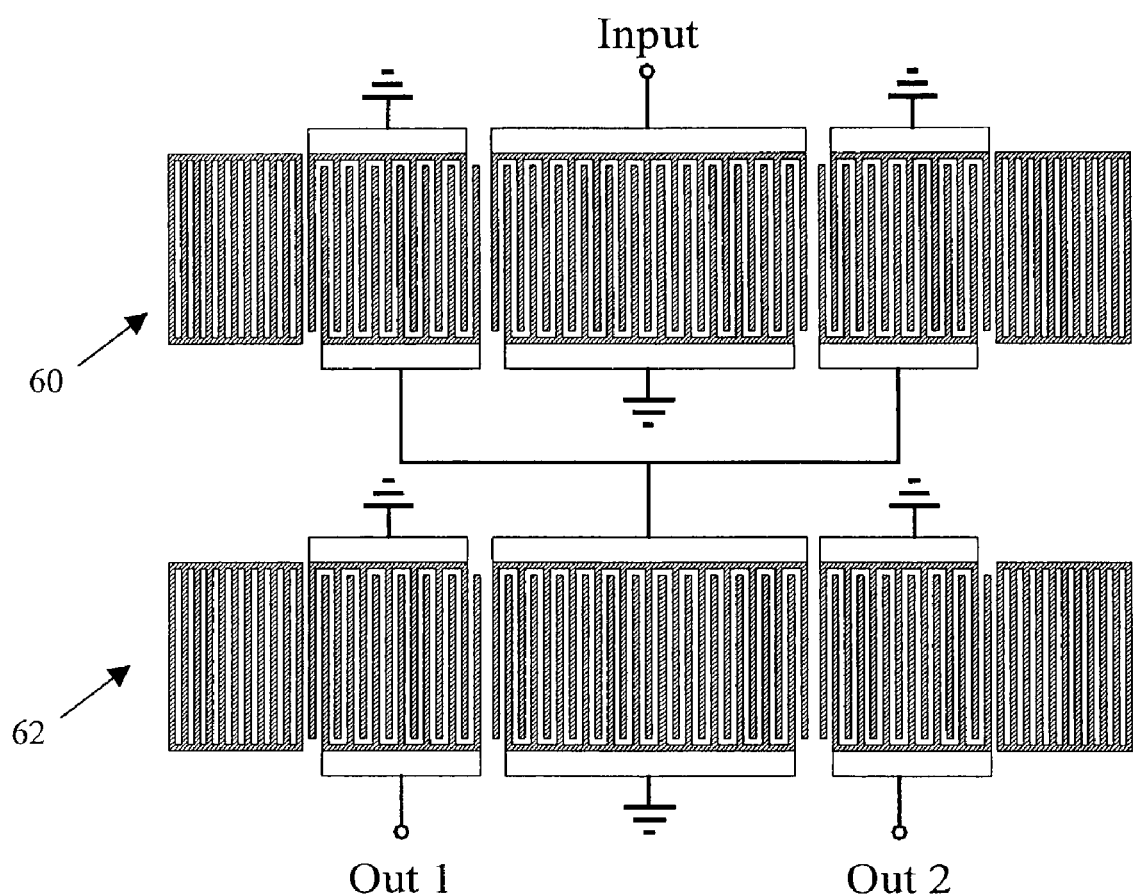
FIG. 7 illustrates a conventional double section DMS type SAW filter with a balanced output.

The RX DMS filter 18' component of the duplexer 14' can comprise a single filter stage as in FIGS. 6(*a*) and 6(*b*) or a plurality of filter stages. For example, a two-stage SAW DMS filter is depicted in FIG. 7. This comprises a pair of single stages 60, 62 where the output of the first stage 60 is unbalanced and where the output of the second stage 62 is balanced. The output signals of the first stage 60 is connected to a single input of the second stage 62 which in turn produces a balanced output so that the resulting filter comprises a pair of DMS stages cascaded in series.

In another configuration, shown in FIGS. 8(*a*) and 8(*b*), the upper busbars 51 of each of the outer IDTs are connected the input of the RX filter, and the lower busbars 52', 52" of each of the outer IDTs is connected to ground. Hence, alternate fingers of the outer IDTs are connected to the input and ground. The output (balanced or unbalanced) is derived from the centre IDT rather than the outer IDTs as in the previous example. While the unbalanced configuration of FIG. 8(*a*), has busbars 50, 53 connected to ground and the output signals respectively, in the balanced case, the centre IDT is a conventional folded type IDT. A folded IDT has three busbars: one 50 which extends the entire length of the IDT and another two 53 each of which extend approximately half the length of the other side. In this configuration one of each of the half-length busbars 53 are connected to a respective one of the output pads of the filter, while the full length busbar 50 is not connected and so has a floating electrical potential.

Using a DMS type filter of the type shown in FIGS. 6(*b*) or 8(*b*) for the RX filter 18' of the duplexer 14' allows direct connection to a balanced input of the RX circuit of the mobile communications handset. However, it will be seen that it is easy to change the RX chip to the type shown in FIGS. 6(*a*) or 8(*a*) to achieve a single ended output from the antenna duplexer, for direct connection to an RX circuit with an unbalanced input.

In this regard, Table 1 shows the filter parameters for a DMS type SAW filter of the type depicted in FIG. 8*a* with an unbalanced output suitable for use in, for example, a Wideband-CDMA handset having a single line RX port. Table 2 shows the filter parameters for a DMS type SAW filter of the type depicted in FIG. 8*b* with a balanced output suitable for use in a Wideband-CDMA handset having a dual balanced RX port. In both cases, the substrate comprises Lithium Tantalate and the electrodes are aluminium, although it will be seen that the invention is not limited to these materials. It will however be seen that according to the requirements of the handset manufacturer, the improved duplexer of the invention can be deployed interchangeably with a duplexer having an unbalanced output.

The TX and RX filters of the present invention include pads for electrical connection to the metallized tracks of the package substrate. These pads fall into the following categories:—input pads, output pads, ground pads. In addition, there may be included pads which serve no electrical function, but which add structural integrity to the duplexer of the present invention in cases where electrical connection between the TX and RX filters and the metallized tracks of the package substrate is affected by flip chip bonding. It is apparent that in cases where flip chip bonding is used, for correct alignment between the pads on the filters and the metallized tracks of the package base, the pads on the filters must be located in pre-determined positions.

In addition, it is desirable for the duplexer of the present invention to be changeable from a balanced RX output type to an unbalanced RX output type by simply replacing the balanced output RX SAW filter with an unbalanced output SAW filter. However to facilitate this interchangeability, the input pads, output pads, and ground pads on both the balanced output RX SAW filter, and on the unbalanced output RX SAW filter must be in the same locations.

FIG. 10(*a*) shows a possible layout of the DMS SAW filter structure of FIG. 8(*a*) on the piezoelectric substrate, and FIG. 10(*b*) shows a possible layout of the DMS SAW filter structure of FIG. 8(*b*). It can be seen that the locations of the pads in FIGS. 10(*a*) and 10(*b*), fulfil the above condition for interchangeability—i.e. that the locations of input, output, and ground pads are the same.

In the case of FIG. 10(*b*), it can be seen that the centre ground pad on the SAW chip, is not electrically connected to any part of the DMS RX SAW filter 18'; in this case, a bump bond which is attached to the centre ground pad will have the sole purpose of adding structural integrity of the duplexer package.

Turning now to FIGS. 9(*a*) to 9(*c*) which illustrate some possible package configurations for the antenna duplexer of the present invention. It will be seen that each of these includes two RX Output pins which, when a balanced output type DMS filter is employed, provide a balanced input for a communications section of a handset. On the other hand if an unbalanced output type DMS filter is employed, then the exact same package can be employed except that one of the RX output pins will be redundant with the other providing the single signal line output. Alternatively, the unbalanced signal can be provided to the two RX output pins which may then be connected together on an external PCB to which the duplexer is mounted. Further alternatively, a package with one less pin could be employed where an unbalanced RX filter is used.

It will be seen from the above description that the DMS type filter to be used for the RX filter 18' of the antenna duplexer can be constructed using a number of alternative configurations summarised below:

TX Filter: ladder type SAW, RX filter: DMS type SAW, FIG. 6(*b*) interchangeable with DMS type SAW, FIG. 6(*a*).

TX Filter: ladder type SAW, RX filter: DMS type SAW, FIG. 8(*b*) interchangeable with DMS type SAW, FIG. 8(*a*).

TX Filter: other type SAW, RX filter: DMS type SAW, FIG. 6(*b*) or 8(*b*) interchangeable with DMS type SAW, FIG. 6(*a*) or 8(*a*).

TX Filter: other type (not SAW), RX filter: DMS type SAW, FIG. 6(*b*) or 8(*b*) interchangeable with DMS type SAW, FIG. 6(*a*) or 8(*a*).

TABLE 1

Typical DMS Filter Parameters for FIG. 8a.
Substrate: 39° Y Rotated X Propagation LiTaO$_3$

| | Symbol | Value | Unit |
|---|---|---|---|
| Wavelength | $\lambda$ | 1.832 | |
| Aperture (absolute) | W | 137 | μm |
| Pitch (P = $\lambda$/2) of input and output IDT | | 0.916 | μm |
| Duty factor (IDT Finger width (absolute)/Pitch) | DF | 0.56 | — |
| IDT Finger width (absolute) | | 0.5130 | μm |
| Total number of finger pairs in centre IDT | Nout | 20.5 | — |
| Number of finger pairs in left outer IDT | Nin 1 | −11.5 | — |
| Number of finger pairs in right outer IDT | Nin 2 | +11.5 | — |
| Gap between centre and outer IDT, measured from centres of fingers (absolute) | | 1.5389 | μm |
| Pitch of reflectors | | 0.9435 | μm |
| Number of fingers in reflector (not pairs) | N ref | 250 | μm |
| Gap between outer IDT and reflector, measured from centres of fingers (absolute) | Gref | 0.916 | μm |
| Aluminium Film Thickness | h | 170 | Nm |

TABLE 2

Typical DMS Filter Parameters for FIG. 8b
Substrate: 39° Y Rotated X Propagation LiTaO$_3$

| | Symbol | Value | Unit |
|---|---|---|---|
| Wavelength | $\lambda$ | 1.832 | |
| Aperture (wavelengths) | W | 75 | — |
| Aperture (absolute) | W | 137 | μm |
| Pitch (P = $\lambda$/2) of input and output IDT | | 0.916 | μm |
| Duty factor (IDT Finger width (absolute)/Pitch) | DF | 0.56 | — |
| IDT Finger width (absolute) | | 0.5130 | μm |
| Total number of finger pairs in both centre IDTs | Nout | 20 | — |
| Number of finger pairs in left outer IDT | Nin 1 | −11.5 | — |
| Number of finger pairs in right outer IDT | Nin 2 | +11.5 | — |
| Gap between centre and outer IDT, measured from centres of fingers (absolute) | | 1.5389 | μm |
| Pitch of reflectors | | 0.9435 | μm |
| Number of fingers in reflector (not pairs) | N ref | 250 | μm |
| Gap between outer IDT and reflector, measured from centres of fingers (absolute) | Gref | 0.916 | $\lambda$ |
| Aluminium Film Thickness | h | 170 | Nm |

The invention claimed is:

1. An antenna duplexer comprising:
a transmission filter, operable in a frequency region of 1920 to 1980 MHz, having an input and an output;
said transmission filter input being arranged to connect to a transmission port of a mobile telecommunications handset;
said transmission filter output being arranged to connect to an antenna of said mobile telecommunications handset;
a Dual Mode Surface Acoustic Wave (SAW) type receiver filter, operable in a frequency region from 2110 to 2170 MHz, having an input and a balanced output;
said receiver filter input being arranged to connect to said antenna; and
said receiver filter output being arranged to connect directly to a balanced input receiver port of said mobile telecommunications handset.

2. The antenna duplexer according to claim 1, further comprising a package having a substrate on which said transmission filter and said receiver filter are mounted.

3. The antenna duplexer according to claim 2, wherein said substrate comprises alumina.

4. The antenna duplexer according to claim 1, further comprising a matching network electrically connected between said transmission filter and said receiver filter.

5. The antenna duplexer according to claim 4, wherein said matching network is connected between said receiver filter input and said antenna.

6. The antenna duplexer according to claim 4, wherein said matching network comprises a microstrip line.

7. The antenna duplexer according to claim 4, wherein said matching network comprises a combination of inductances and capacitances.

8. The antenna duplexer according to claim 1, wherein said transmission filter comprises one of a ladder type SAW filter, a Dual Mode type SAW filter and a non-SAW filter.

9. The antenna duplexer according to claim 1, wherein said receiver filter comprises a substrate comprising one of Lithium Tantalate, Lithium Niobate, Quartz and Langasite.

10. The antenna duplexer according to claim 1, wherein said receiver filter comprises one of a single layer and a multi-layer electrode;
at least one of said single layer electrode and said multi-layer electrode comprising one of aluminium, an aluminium alloy and another metal.

11. The antenna duplexer according to claim 1, wherein each of said transmission filter and said receiver filter comprises one of a bandpass, a low pass and a notch type filter.

12. The antenna duplexer according to claim 11, wherein each of said transmission filter and said receiver filter has a stop band at the passband of the other of the transmission filter and receiver filter.

13. The antenna duplexer according to claim 1, wherein each of said transmission filter and said receiver filter is arranged to simultaneously transmit and receive respective signals to and from said antenna.

14. The antenna duplexer according to claim 1, wherein said receiver filter comprises a multi-stage Dual Mode type SAW filter.

15. An antenna duplexer comprising:
a package having a substrate on which a transmission filter and a Dual Mode Surface Acoustic Wave type receiver filter are mounted;
said transmission filter having an input and an output;
said transmission filter input being arranged to connect to a transmission port of a mobile telecommunications handset;
said transmission filter output being arranged to connect to an antenna for said mobile telecommunications handset;
said Dual Mode Surface Acoustic Wave receiver filter having an input and a balanced output;
said Dual Mode Surface Acoustic Wave receiver filter input being arranged to connect to said antenna; and
said Dual Mode Surface Acoustic Wave receiver filter output being arranged to connect directly to an input receiver port of said mobile telecommunications handset;
wherein said substrate includes a pair of pads arranged to interchangeably connect to one of said receiver filter balanced output and a receiver filter unbalanced output of predetermined Dual Mode Surface Acoustic Wave type receiver filter.

16. A telecommunications handset comprising a communications section including a transmission port and a receiver port and said antenna duplexer according to claim 1, wherein an impedance of the balanced output matches an input impedance of the receiver port of the telecommunications handset.

* * * * *